(12) United States Patent
Rawlinson (10) Patent No.: US 9,306,247 B2
(45) Date of Patent: Apr. 5, 2016

(54) METHOD OF DETECTING BATTERY PACK DAMAGE

(71) Applicant: Atieva, Inc., Redwood City, CA (US)

(72) Inventor: Peter Dore Rawlinson, Worcestershire (GB)

(73) Assignee: ATIEVA, INC., Menlo Park, CA (US)

( * ) Notice: Subject to any disclaimer, the term of this patent is extended or adjusted under 35 U.S.C. 154(b) by 250 days.

(21) Appl. No.: 14/133,354

(22) Filed: Dec. 18, 2013

(65) Prior Publication Data

US 2015/0171486 A1    Jun. 18, 2015

Related U.S. Application Data

(63) Continuation of application No. 14/132,560, filed on Dec. 18, 2013.

(51) Int. Cl.
| | |
|---|---|
| *H01M 10/48* | (2006.01) |
| *H01M 10/625* | (2014.01) |
| *H01M 10/63* | (2014.01) |
| *H01M 10/6556* | (2014.01) |
| *G01R 31/36* | (2006.01) |
| *H01M 10/613* | (2014.01) |

(52) U.S. Cl.
CPC .......... *H01M 10/482* (2013.01); *G01R 31/3627* (2013.01); *H01M 10/488* (2013.01); *H01M 10/502* (2013.01); *H01M 10/5004* (2013.01); *H01M 10/5016* (2013.01); *H01M 10/5057* (2013.01); *H01M 10/625* (2015.04); *H01M 10/63* (2015.04); *H01M 10/6556* (2015.04); *H01M 2200/20* (2013.01); *H01M 2220/20* (2013.01)

(58) Field of Classification Search
CPC ............ H01M 10/482; H01M 10/486; H01M 10/5004; H01M 10/502; H01M 10/5016; H01M 10/5057; H01M 10/5079; H01M 10/488; H01M 2220/20

See application file for complete search history.

(56) References Cited

U.S. PATENT DOCUMENTS

| | | | | |
|---|---|---|---|---|
| 6,410,177 B1 * | 6/2002 | Iyasu | .................. | H01M 8/0271 429/434 |
| 6,664,000 B1 * | 12/2003 | Sonobe | ................... | H01M 2/34 429/100 |
| 2010/0136384 A1 * | 6/2010 | Kreiner | ............... | H01M 10/482 429/50 |
| 2010/0136391 A1 * | 6/2010 | Prilutsky | .......... | H01M 10/5004 429/62 |
| 2011/0206948 A1 * | 8/2011 | Asai | ..................... | H01M 2/0473 429/7 |
| 2012/0009455 A1 * | 1/2012 | Yoon | ..................... | H01M 10/65 429/120 |
| 2012/0107664 A1 * | 5/2012 | Lee | ..................... | H01M 2/1077 429/120 |
| 2012/0171532 A1 * | 7/2012 | Lee | ..................... | H01M 2/1077 429/72 |

FOREIGN PATENT DOCUMENTS

EP    2 546 904 A1    1/2013

* cited by examiner

*Primary Examiner* — Muhammad Siddiquee
(74) *Attorney, Agent, or Firm* — Patent Law Office of David G. Beck (57) ABSTRACT

A method is provided for detecting when a vehicle mounted battery pack is damaged from an impact with a piece of road debris or other obstacle. Positioned within the battery pack is a plurality of deformable cooling conduits located between the lower surface of the batteries within the battery pack and the lower battery pack enclosure panel. One or more sensors are incorporated into the cooling conduits which monitor coolant flow rate or pressure. When the cooling conduits deform, a change in coolant flow/pressure occurs that is detected by the sensors integrated into the conduit's coolant channels. A system controller, coupled to a sensor monitoring subsystem, may provide any of a variety of responses when cooling conduit deformation is detected.

13 Claims, 10 Drawing Sheets

METHOD OF DETECTING BATTERY PACK DAMAGE

CROSS-REFERENCE TO RELATED APPLICATION

This application is a continuation of U.S. patent application Ser. No. 14/132,560, filed 18 Dec. 2013, the disclosure of which is incorporated herein by reference for any and all purposes.

FIELD OF THE INVENTION

The present invention relates generally to battery packs and, more particularly, to a system for detecting damage in a vehicle mounted battery pack.

BACKGROUND OF THE INVENTION

In response to the demands of consumers who are driven both by ever-escalating fuel prices and the dire consequences of global warming, the automobile industry is slowly starting to embrace the need for ultra-low emission, high efficiency cars. While some within the industry are attempting to achieve these goals by engineering more efficient internal combustion engines, others are incorporating hybrid or all-electric drive trains into their vehicle line-ups. To meet consumer expectations, however, the automobile industry must not only achieve a greener drive train, but must do so while maintaining reasonable levels of performance, range, reliability, safety and cost.

In recent years there have been several incidents of a rechargeable battery pack, either contained within a laptop computer or utilized in a vehicle, catching on fire. As a result, one of the primary issues impacting consumer confidence with respect to both hybrid and all-electric vehicles is the risk of a battery pack fire.

Rechargeable batteries tend to be relatively unstable and prone to thermal runaway, an event that occurs when a battery's internal reaction rate increases to such an extent that it is generating more heat than can be withdrawn. If the reaction rate and generation of heat go unabated, eventually the heat generated becomes great enough to cause the battery and materials in proximity to the battery to combust. While thermal runaway is typically the result of a battery short or a manufacturing defect, damage such as that which may occur during an accident or when road debris dents or punctures the battery pack may also lead to a thermal runaway event.

Due to the risk of a battery pack fire, hybrid and electric vehicle (EV) manufacturers use a variety of techniques to shield their battery packs from the possible damage that may result from road debris or a vehicle collision. For example, in a vehicle using a relatively small battery pack such as a hybrid, the pack may be protected by placing it within the rear trunk, behind the rear seats, under the front seats, or in another comparatively well protected location. Vehicles utilizing large battery packs typically are forced to mount the pack under the car. To protect such a pack, a ballistic shield may be located between the road surface and the bottom of the pack as disclosed in U.S. Pat. Nos. 8,286,743 and 8,393,427.

Although the prior art teaches a variety of mounting techniques that can either be used to place the battery pack in a relatively protected region of a car or to otherwise shield the battery pack from potential harm, given the severity of the consequences accompanying a thermal runaway event, techniques for minimizing the effects of such an event are desired. The present invention provides a detection system that may be used to monitor for possible battery pack damage, thereby helping to decrease the likelihood of a damaged battery pack leading to a catastrophic battery pack event.

SUMMARY OF THE INVENTION

The present invention provides a method for detecting when an exposed region of a battery pack mounted to an electric vehicle has been damaged due to an impact with road debris or other objects, where the battery pack is configured to house a plurality of batteries, the method including the steps of (i) positioning a plurality of deformable cooling conduits between a lower surface of each of the plurality of batteries and an upper surface of a lower battery pack enclosure panel, where at least one coolant containing channel is integrated into each of the deformable cooling conduits, (ii) incorporating at least one sensor (e.g., a flow rate sensor, a pressure sensor) into the plurality of deformable cooling conduits, where the at least one sensor monitors a coolant characteristic (e.g., coolant flow rate or pressure), (iii) monitoring the at least one sensor, (iv) outputting a first control signal to a system controller when the characteristic monitored by the at least one sensor is within a preset range of values, and (v) outputting a second control signal to the system controller when the characteristic monitored by the at least one sensor is outside of the preset range of values, where deformation of a portion of the plurality of deformable cooling conduits due to an object striking the lower surface of the lower battery pack enclosure panel causes the characteristic monitored by the at least one sensor to fall outside of the preset range of values. The method may further comprise one or more of the steps of (i) modifying coolant flow through at least a portion of the plurality of deformable cooling conduits when the system controller receives the second control signal, (ii) terminating coolant flow through at least a portion of the plurality of deformable cooling conduits when the system controller receives the second control signal, (iii) activating a fire control system when the system controller receives the second control signal, (iv) modifying an electrical load applied to at least a portion of the plurality of batteries when the system controller receives the second control signal, (v) recording an event log entry using an on-board recording system each time said system controller receives the second control signal, and (vi) transmitting an event report using an on-board communication system each time said system controller receives the second control signal.

In another aspect, the method may include the step of positioning a thermal insulator between the deformable cooling conduits and the upper surface of the lower battery pack enclosure panel. A plurality of stand-offs may be positioned between the deformable cooling conduits and the upper surface of the lower battery pack enclosure panel, where the stand-offs define a gap between the deformable cooling conduits and the upper surface of the lower battery pack enclosure panel, where the gap is filled with the thermal insulator, and where the thermal insulator is air. The method may further include the step of positioning a thermally conductive material adjacent to and in contact with a lower surface of each of the plurality of deformable cooling conduits.

A further understanding of the nature and advantages of the present invention may be realized by reference to the remaining portions of the specification and the drawings.

DESCRIPTION OF THE SPECIFIC EMBODIMENTS

In the following text, the terms "battery", "cell", and "battery cell" may be used interchangeably and may refer to any of a variety of different battery configurations and chemistries. Typical battery chemistries include, but are not limited to, lithium ion, lithium ion polymer, nickel metal hydride, nickel cadmium, nickel hydrogen, nickel zinc, and silver zinc. The terms "battery pack" and "battery pack enclosure" may be used interchangeably and refer to an enclosure containing one or more batteries electrically interconnected to achieve the desired voltage and capacity. The term "electric vehicle" as used herein may refer to an all-electric vehicle, also referred to as an EV, a plug-in hybrid vehicle, also referred to as a PHEV, or a hybrid vehicle, also referred to as a HEV, where a hybrid vehicle utilizes multiple sources of propulsion including an electric drive system.

Figure 1:
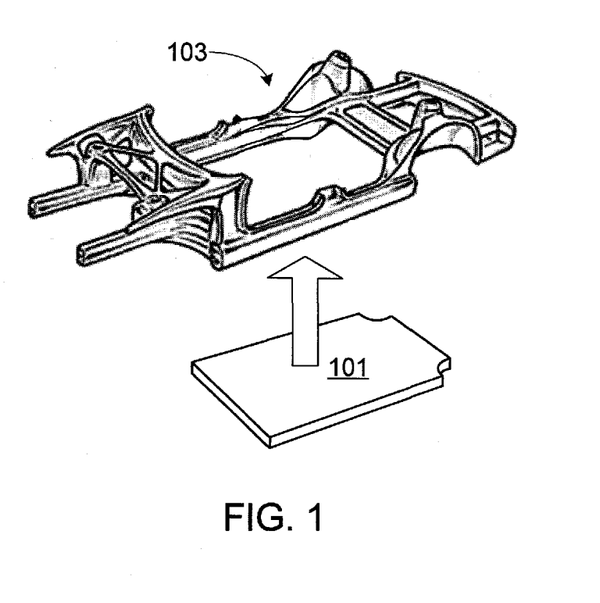
FIG. 1 provides a perspective view of a battery pack and the vehicle chassis to which it is to be mounted.

FIG. 1 provides a perspective view of a battery pack 101 configured to be mounted under vehicle chassis 103. It should be understood that the present invention is not limited to a specific battery pack mounting scheme, battery pack size, or battery pack configuration.

Figure 2:
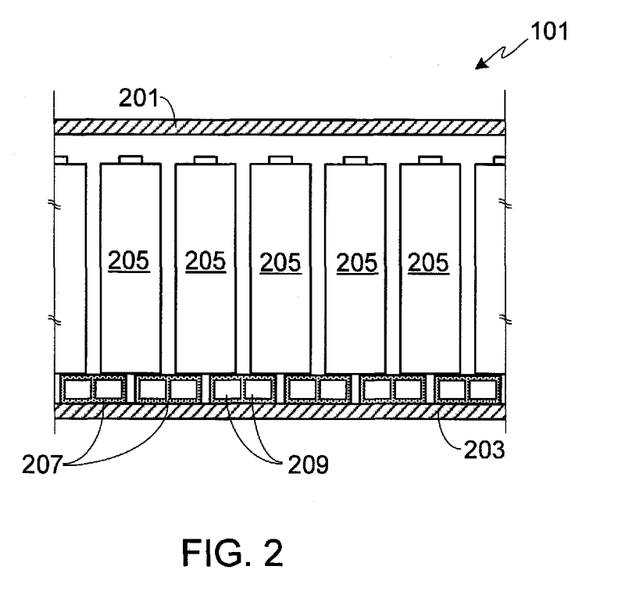
FIG. 2 provides a cross-sectional view of a portion of the battery pack shown in FIG. 1.

FIG. 2 provides a cross-sectional view of a portion of battery pack 101. For purposes of clarity, battery interconnects and battery mounts are not included in this view. Visible in FIG. 2 is a portion of the upper pack enclosure panel 201, a portion of the lower pack enclosure panel 203, and a plurality of batteries 205. Note that the enclosure side panels are not shown in this view. Batteries 205 are preferably cylindrical batteries, for example batteries utilizing an 18650 form-factor, and are positioned within the battery pack so that the axis of the cylinder (i.e., the cylindrical axis) is substantially perpendicular to both lower enclosure panel 203 and the surface of the road. Interposed between the base of each cylindrical battery 205 and lower panel 203 are a plurality of deformable cooling conduits 207 through which a liquid coolant, i.e., a heat transfer medium, is pumped. As shown, in the preferred embodiment cooling conduits 207 are aligned with lower panel 203, resulting in the coolant within channels 209 flowing in a direction substantially perpendicular to the axes of the cylindrical batteries. By regulating the flow of coolant within conduits 207 and/or regulating the transfer of heat from the coolant to another temperature control system, the temperature of cells 205 may be regulated so that the cells remain within their preferred operating range.

Figure 3:
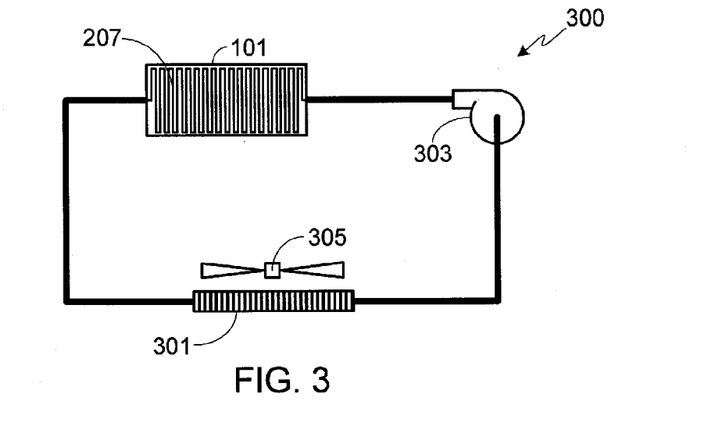
FIG. 3 illustrates an exemplary cooling system suitable for use with the battery pack deformable cooling conduits of the invention.
Figure 4:
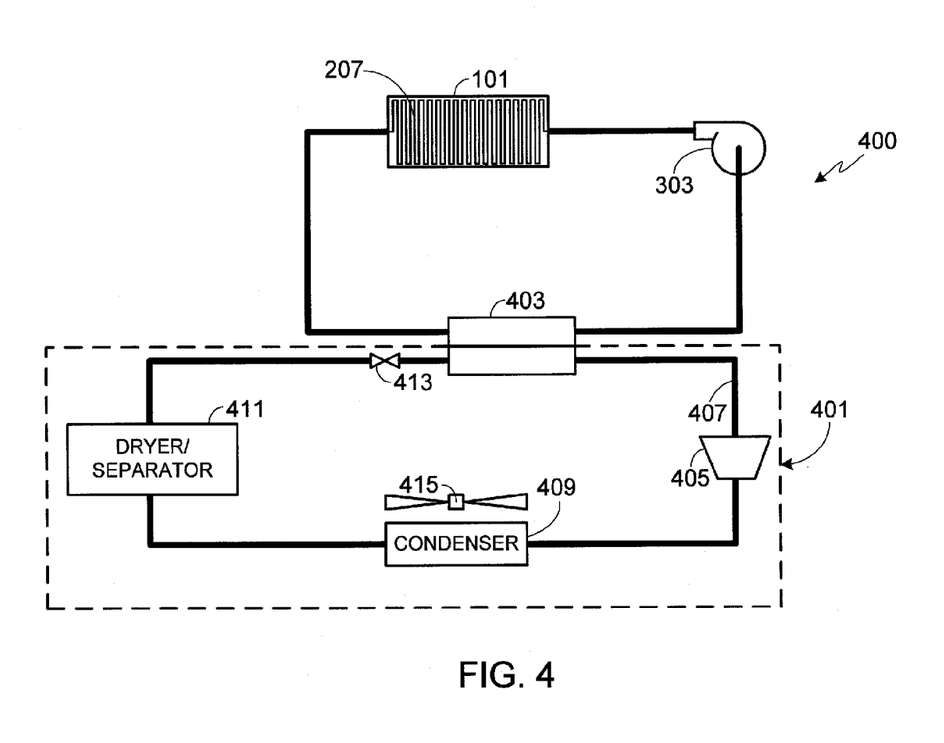
FIG. 4 illustrates an alternate exemplary cooling system suitable for use with the battery pack deformable cooling conduits of the invention.
Figure 5:
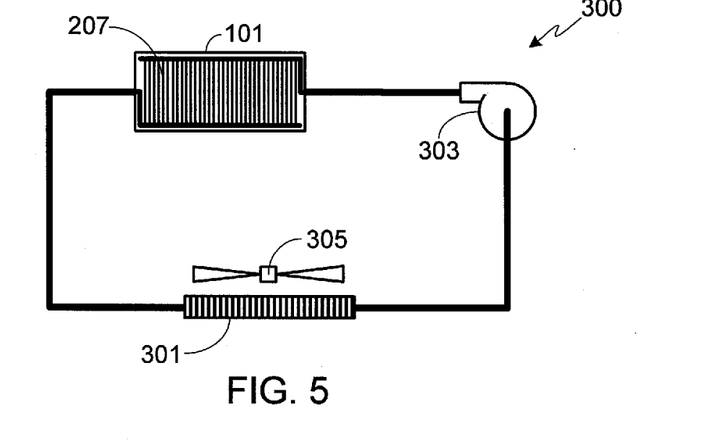
FIG. 5 illustrates the exemplary cooling system shown in FIG. 3 with a different coolant conduit configuration within the battery pack.

FIGS. 3 and 4 illustrate exemplary cooling systems that may be coupled to cooling conduits 207. In system 300 shown in FIG. 3, the coolant within conduits 207 is pumped through a radiator 301 using a pump 303. A blower fan 305 may be used to force air through radiator 301 to insure cooling when the car is stationary. In system 400 shown in FIG. 4, the coolant within conduits 207 is coupled to a thermal management system 401 via a heat exchanger 403. Preferably thermal management system 401 is a refrigeration system and as such, includes a compressor 405 to compress the low temperature vapor in refrigerant line 407 into a high temperature vapor and a condenser 409 in which a portion of the captured heat is dissipated. After passing through condenser 409, the refrigerant changes phases from vapor to liquid, the liquid remaining at a temperature below the saturation temperature at the prevailing pressure. The refrigerant then passes through a dryer 411 that removes moisture from the condensed refrigerant. After dryer 411, refrigerant line 407 is coupled to heat exchanger 403 via thermal expansion valve 413 which controls the flow rate of refrigerant into heat exchanger 403. Additionally, in the illustrated system a blower fan 415 is used in conjunction with condenser 409 to improve system efficiency. It should be understood that battery pack coolant conduits 207 may be coupled to other cooling/thermal management systems, and the cooling systems shown in FIGS. 3 and 4 are only meant to illustrate some common configurations for use with the conduits of the invention. Additionally, the geometry of cooling conduits 207 shown in FIGS. 3 and 4 is only meant to illustrate one possible configuration. For example, FIG. 5 shows the cooling system of FIG. 3 with a different conduit configuration within battery pack 101, one utilizing coolant manifolds. The invention may use other configurations as well, assuming that the conduits are placed between the batteries 205 and the lower enclosure panel 203 as previously described and illustrated.

Cooling conduits 207 serve a three-fold purpose. First, during normal operation of the vehicle and the battery pack, the coolant within conduits 207 draws heat away from batteries 205, thereby allowing the temperature of the batteries to remain within the preferred operating range. Second, during a non-normal event in which an object such as road debris from under the vehicle strikes the bottom panel 203 of pack 101, conduits 207 help to prevent catastrophic damage to the pack by absorbing energy through conduit deformation. Third, and as described in detail below, by incorporating pressure or flow sensors within the conduits 207, when an object strikes bottom panel 203 and deforms the cooling conduits, the change in coolant pressure or flow rate provides an early warning that the battery pack has been struck with sufficient force to potentially compromise the battery pack and cause the initiation of a thermal runaway event within the enclosed batteries.

Figure 6:
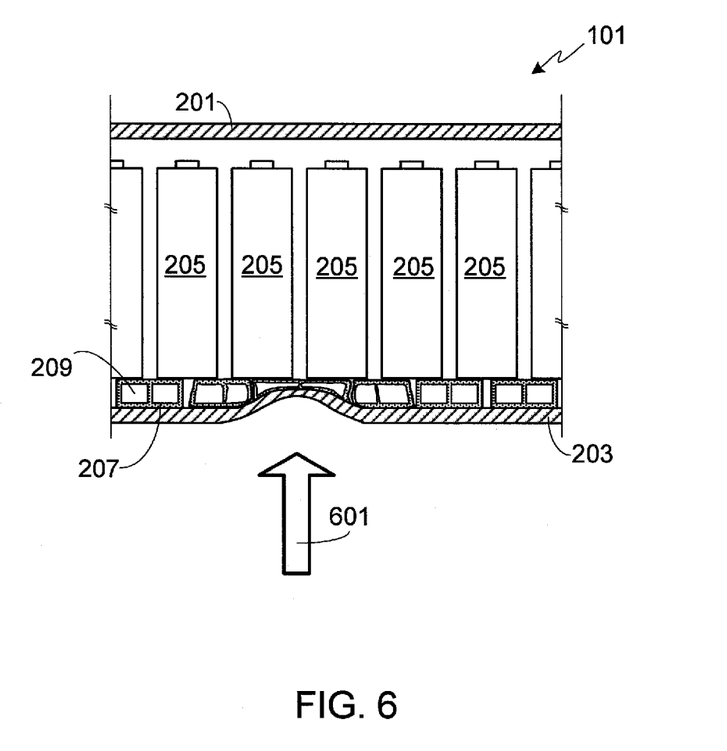
FIG. 6 provides the cross-sectional view of the battery pack portion shown in FIG. 2 after an object strikes the bottom of the battery pack enclosure.

As illustrated in FIG. 6, when an object (e.g., road debris) under the vehicle is forced upwards in direction 601, the object causes the bottom enclosure panel 203 to deform as well as those portions of conduits 207 within the strike zone. As the lower panel 203 and the conduits within the strike region deform, energy is absorbed. If sufficient energy is absorbed through this process, damage to the batteries 205 within the strike region can be significantly limited, thereby potentially averting a thermal runaway event. Preferably conduits 207 are fabricated from polyethylene or a similar material which is capable of severe deformation without cracking or breaking. By selecting an electrically non-conductive coolant as preferred, if conduits 207 do crack or break when deformed, the released coolant will not cause a short within the battery pack. Additionally, deformation of the cooling conduits causes a change in coolant flow which, in turn, causes a change in the pressure within the conduits. Accordingly, by incorporating sensors within the coolant conduits and monitoring coolant flow and/or coolant pressure, whenever an object deforms the bottom of the battery pack and the conduits within the strike zone as illustrated, an almost immediate indicator of the event is detected, thus allowing the control system to take appropriate action as described in detail below.

It should be understood that the configuration of the cooling conduits, the thermal efficiency of the cooling system, and the degree of protection afforded by the cooling conduits can be tailored to meet the design requirements for a particular vehicle and its battery pack cooling system without departing from the particulars of the invention. A variety of alternate cooling configurations suitable for use with the present invention are illustrated in co-pending and co-assigned U.S. patent application Ser. No. 14/083,476, filed 19 Nov. 2013, and Ser. No. 14/132,179, filed 18 Dec. 2013, incorporated herein for any and all purposes. For example, in most applications cooling conduits 207 are fabricated from a thermally conductive material, thus insuring efficient transfer of heat from the batteries 205 to the battery thermal management system. However, as the inventor has found it generally desirable to limit thermal transfer between the cooling conduits 207 and the battery pack enclosure panel 203, in the preferred embodiment one or more layers of a thermal insulator are added between the conduits and the battery pack enclosure. For example, in the configuration illustrated in FIG. 7, thermal transfer between the two structures is limited by placing an air gap 701 between cooling conduits 207 and the battery pack enclosure panel 203. In this configuration stand-offs 703 help to insure the mechanical strength of the battery pack structure while still maintaining a sufficient air gap 701 to limit heat transfer to an acceptable level. Preferably stand-offs 703 are fabricated from a material with low thermal conductivity, for example less than 1.0 $Wm^{-1}K^{-1}$ at 25° C., and more preferably less than 0.2 $Wm^{-1}K^{-1}$ at 25° C. Stand-offs may be integral to panel 203, integral to conduits 207 (for example, extruded in the same extrusion as that used to fabricate the cooling conduits 207), or independent of both. A benefit of using an air gap 701 to separate the conduits from the lower enclosure panel, and for minimizing the number of stand-offs 703, is that when an object hits the lower surface of panel 203, the panel can deform prior to even impacting the deformable cooling conduits 207, thereby enhancing protection of batteries 205.

Figure 8:
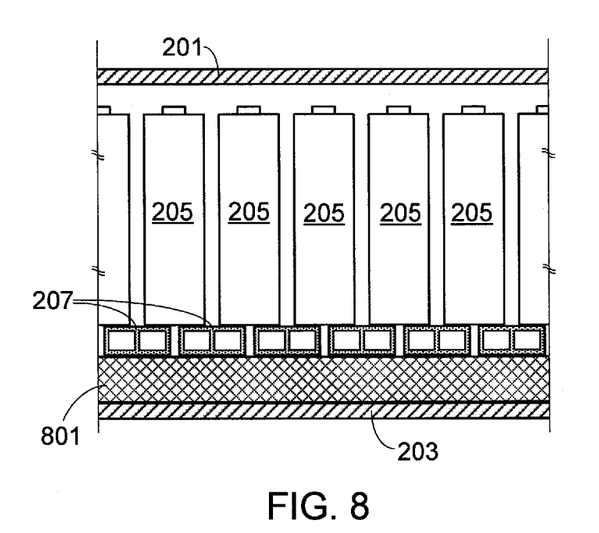
FIG. 8 provides the cross-sectional view of the battery pack portion shown in FIG. 2 with the inclusion of a layer of thermally insulating material located between the cooling conduits and the battery pack enclosure.

In the configuration illustrated in FIG. 8, air gap 701 has been replaced with a layer 801 of a thermally insulating material, layer 801 preferably having a thermal conductivity of less than 1.0 $Wm^{-1}K^{-1}$ at 25° C., and more preferably of less than 0.2 $Wm^{-1}K^{-1}$ at 25° C. In one configuration, layer 801 is formed from a compressible material, thus allowing a degree of enclosure panel deformation prior to impacting conduits 207.

Figure 7:
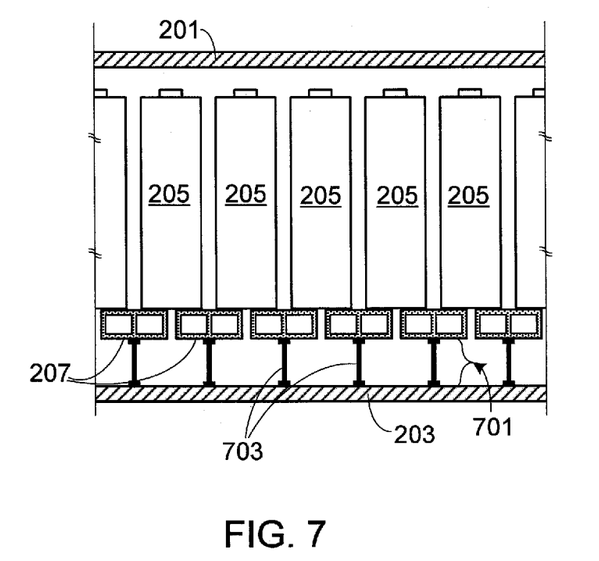
FIG. 7 provides the cross-sectional view of the battery pack portion shown in FIG. 2 with the inclusion of an air gap between the cooling conduits and the battery pack enclosure.
Figure 9:
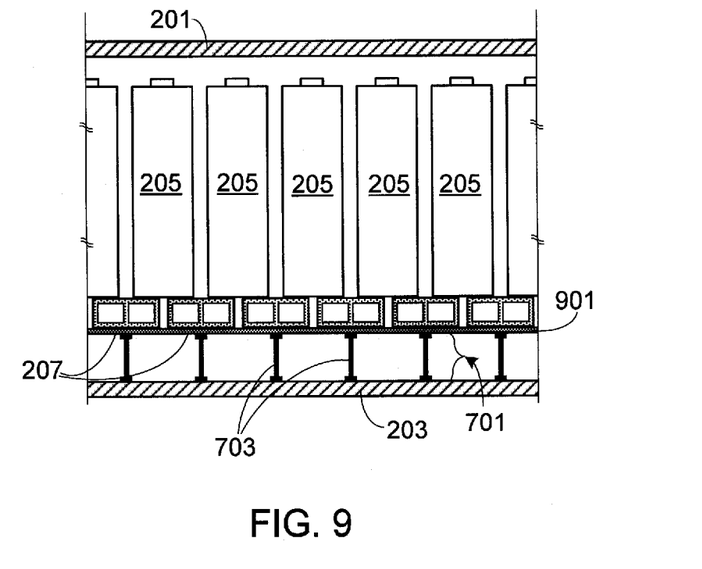
FIG. 9 provides the cross-sectional view of the battery pack portion shown in FIG. 7 with the inclusion of a sheet of thermally conductive material in contact with the lower surfaces of the cooling conduits.
Figure 10:
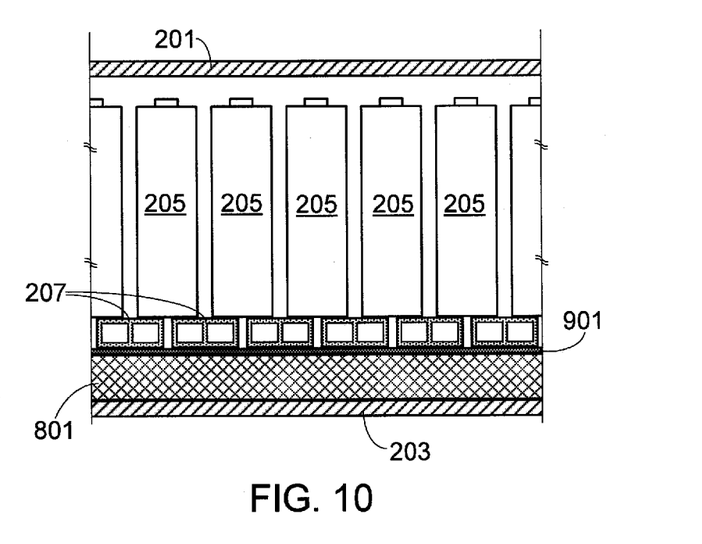
FIG. 10 provides the cross-sectional view of the battery pack portion shown in FIG. 8 with the inclusion of a sheet of thermally conductive material in contact with the lower surfaces of the cooling conduits.

FIGS. 9 and 10 illustrate modifications of the configurations shown in FIGS. 7 and 8, respectively. In these configurations a layer 901 of thermally conductivity material, such as a sheet of aluminum, is placed in contact with the lower surface of each of the cooling conduits 207. Layer 901 transfers heat between cooling conduits, thereby helping to prevent localized heating, i.e., hot spots, for example when one battery begins to run at a higher temperature than the surrounding cells. In the configuration illustrated in FIG. 9, layer 901 is thermally isolated from enclosure panel 203 by air gap 701 while in the configuration illustrated in FIG. 10, sheet 901 is thermally isolated from enclosure panel 203 by low thermal conductivity sheet 801.

Figure 11:
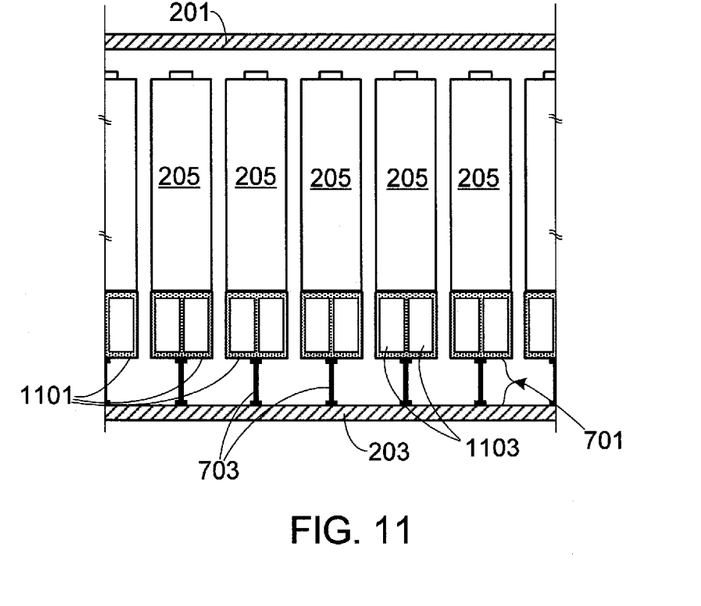
FIG. 11 provides the cross-sectional view of the battery pack portion shown in FIG. 7 with an alternate configuration for the deformable cooling conduits.

In addition to varying the thermal characteristics of the battery pack by adding one or more layers of thermally insulating and/or thermally conductive material between the cooling conduits and the battery pack enclosure, it should be understood that the configuration of the cooling conduits may also be tailored to meet the design requirements for a particular vehicle. For example and as shown in FIG. 11, by increasing the depth of the conduits, and thus the separation distance between lower enclosure panel 203 and batteries 205, a larger conduit deformation zone is provided. A larger conduit deformation zone, in turn, allows an object striking the bottom of the battery pack to deform both panel 203 and conduits 1101 to a much greater extent before the batteries are damaged. Additionally, due to the larger internal diameter of channels 1103 within conduits 1101, a greater degree of conduit deformation may occur before coolant flow within the affected conduit stops completely. An added benefit of this approach is that the larger channels within conduits 1101 provide greater cooling capacity.

Figure 12:
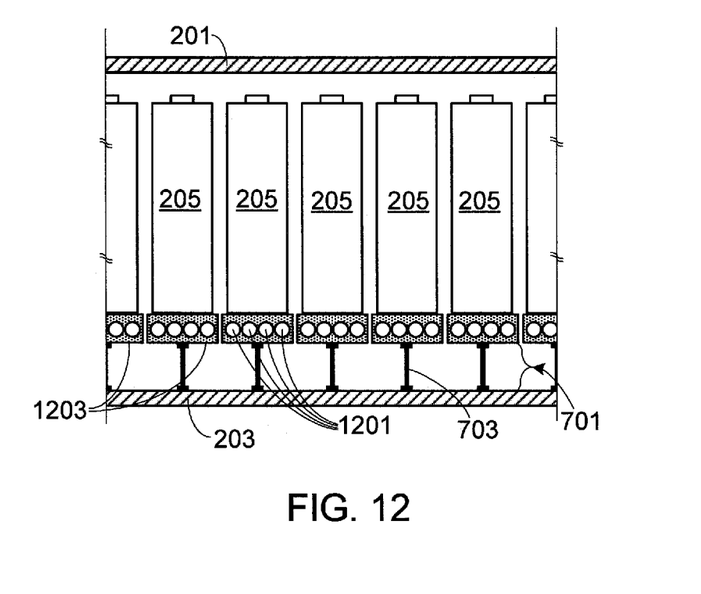
FIG. 12 provides the cross-sectional view of the battery pack portion shown in FIG. 7 with an alternate configuration for the deformable cooling conduits.

FIG. 12 illustrates another configuration in which the number of channels 1201 within each conduit 1203 is increased and the shape of each channel has been changed to cylindrical. As a result, the compression strength of the conduits has been increased, leading to a less deformable structure. At the same time, given the size of the channels as well as the number of channels in proximity to each battery 205, during a deformation event (i.e., a collision with an object) it is less likely that all cooling will be terminated for any particular cell.

Figure 13:
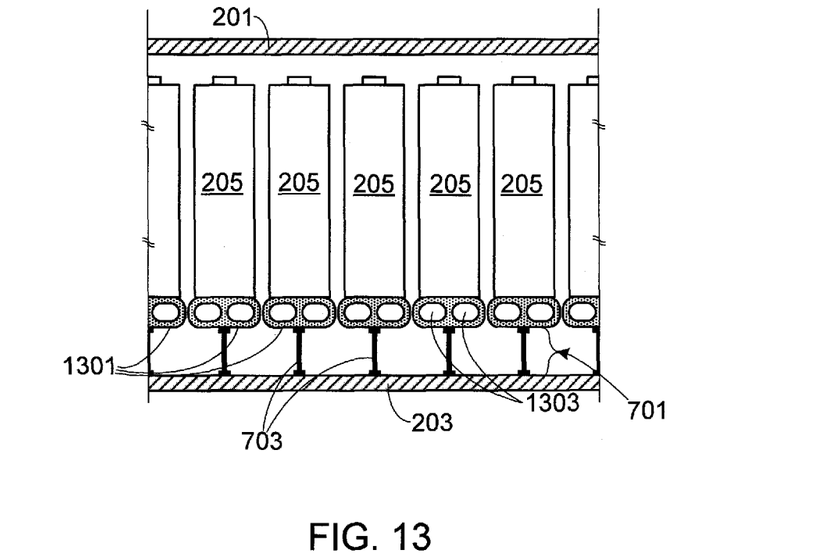
FIG. 13 provides the cross-sectional view of the battery pack portion shown in FIG. 7 with an alternate configuration for the deformable cooling conduits.

FIG. 13 illustrates another configuration in which both the corners of each conduit 1301 and the corners of each channel 1303 within the conduits are rounded. As a result, the large conduit surface area in contact with the battery structures is retained while still achieving a conduit which is less likely to break during deformation.

As previously noted, the undercarriage crumple zone can be tailored to meet the specific requirements for a particular vehicle design. Therefore a vehicle in which the battery pack is very exposed, for example due to a low mounting location under the vehicle, or in which the battery pack is more likely to encounter more road debris, for example in a sport utility vehicle (SUV), can be provided with more protection than a vehicle in which the battery pack is less exposed or less likely to encounter road debris. Features of the crumple zone that can be altered to achieve the desired characteristics include the number of channels per conduit, width and height of the conduits, cross-sectional shape and size of each channel, cross-sectional shape and size of each conduit, conduit wall thickness (i.e., the thickness of the wall separating the channels from the outer conduit wall), conduit material, lower enclosure panel thickness, and lower enclosure panel material. Preferably the deformable cooling conduits are made from a plastic polymer such as polyethylene or polypropylene. If desired, the material may be treated to improve thermal conductivity, while still retaining its electrically non-conductive properties. The lower enclosure panel is preferably fabricated from a metal such as aluminum or steel, although other materials may be used (e.g., a thermally insulating composite material).

Figure 14:
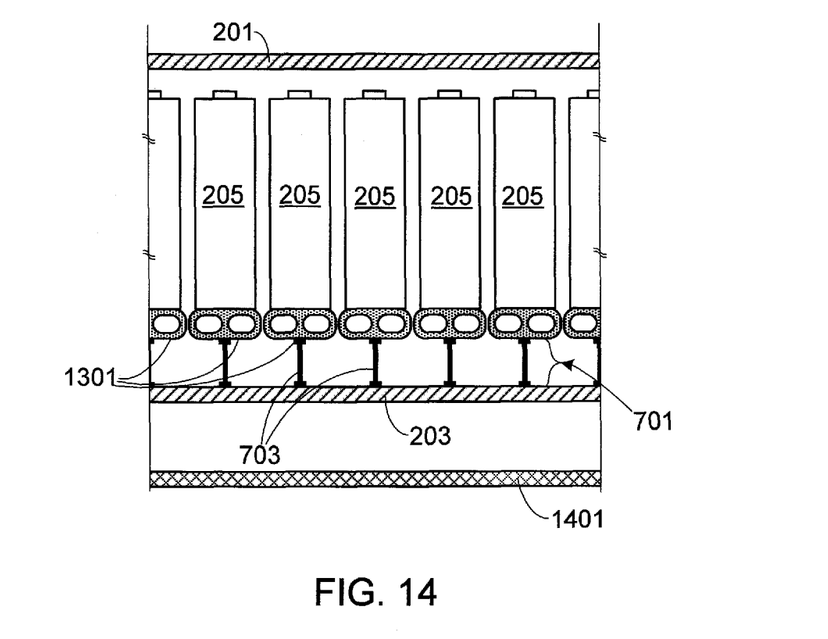
FIG. 14 provides the cross-sectional view of the battery pack portion shown in FIG. 13 with the addition of an underlying ballistic shield.

In at least one embodiment, and as illustrated in FIG. 14, the performance of the undercarriage crumple zone is enhanced through the inclusion of a ballistic shield 1401 mounted between the lower battery pack enclosure panel 203 and the road surface (not shown). Shield 1401 absorbs some of the impact energy from road debris or other objects prior to those objects striking the outer surface of panel 203. Furthermore, by spacing shield 1401 at some distance from panel 203 as shown in the preferred embodiment, shield 1401 is less likely to be driven into the lower enclosure panel during a strike. Accordingly, while shield 1401 may be mounted to, and in contact with, panel 203, preferably it is spaced between 1 and 15 centimeters apart from panel 203. If desired, the void between the shield 1401 and panel 203 may be filled with a compressible material such as an open- or closed-cell sponge or foam that enhances the ability of the battery pack to absorb impact energy. Shield 1401 may be fabricated from a metal (e.g., aluminum), although preferably a lighter weight material such as a high density plastic is used in order to lower vehicle weight.

As described above, when road debris or other obstacles hit the bottom of the battery pack with sufficient force to potentially damage the batteries within the pack, the cooling conduits positioned between the batteries and the lower pack enclosure panel deform, thereby helping to prevent catastrophic damage to the pack by absorbing some of the impact energy. Additionally, deformation of one or more of the cooling conduits causes a reduction, and in some instances a complete interruption of coolant flow, depending upon the amount of conduit/cooling channel deformation. In accordance with the invention, the reduction and/or interruption of coolant flow in one or more coolant channels is detected by flow or pressure sensors integrated into one or more of the coolant channels. Once a possible battery pack impact has been detected, the system can be configured to perform any of a variety of tasks, both in order to warn the driver or other party of the impact as well as mitigate the effects of possible battery damage.

Figure 15:
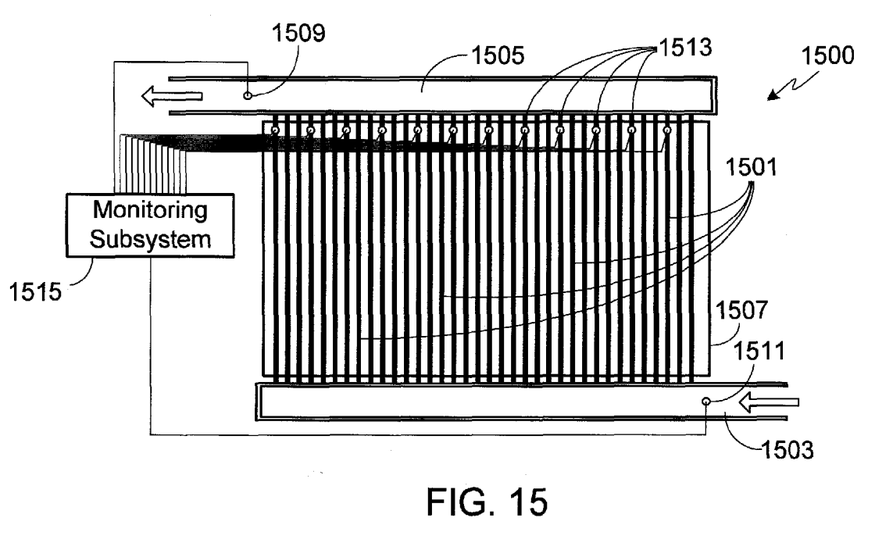
FIG. 15 illustrates various flow and/or pressure sensor locations in a battery pack or battery pack module utilizing cooling conduits arranged in parallel between the coolant intake and exhaust manifolds.

It will be appreciated that the number and location of the coolant conduit sensors depends, at least in part, on the configuration of the cooling conduits. For example, in the embodiment illustrated in FIG. 15, cooling conduits 1501 operate in parallel with each conduit being coupled to a coolant intake manifold 1503 and a coolant exhaust manifold 1505. Note that battery enclosure 1507 into which the cooling system is incorporated may comprise an entire battery pack or a single battery module where the battery pack uses multiple modules and where each battery pack module contains multiple batteries. Note that for clarity, no batteries are shown within enclosure 1507. System 1500 may use a single sensor 1509 integrated into coolant exhaust manifold 1505. More preferably, system 1500 includes a sensor 1511 integrated into coolant intake manifold 1503 in addition to the sensor integrated into the exhaust manifold, thus allowing the system to easily distinguish between changes in coolant flow/pressure due to a deformation of the cooling conduits and changes due to other factors such as a malfunctioning coolant pump or coolant control valve. In addition to sensors 1509 and 1511, in at least one embodiment one or more sensors 1513 are incorporated into individual cooling conduits, sensors 1513 allowing the location of the impact to be estimated. Additionally, with a sufficient number of sensors 1513 the severity of the impact can be estimated by noting the number of affected conduits. Preferably sensors 1513 are located close to the juncture of the corresponding conduit and the exhaust manifold. In at least one embodiment in which parallel cooling conduits are used, a sensor 1513 is located within each conduit rather than just some of the conduits as shown. With a large number of sensors 1513, and in particular embodiments incorporating a sensor per cooling conduit, it is not necessary to monitor the entrance and exhaust manifolds. While the use of multiple sensors 1513 is more sensitive to flow and/or pressure changes than merely monitoring the manifolds with sensors 1509 and 1511, in some instances this approach is cost prohibitive, both due to the large number of sensors as well as the corresponding system complexity required to support these sensors. Note that in this figure the sensors are shown coupled to the monitoring subsystem 1515. Subsystem 1515 may be a separate system or incorporated into the control system as preferred.

Figure 16:
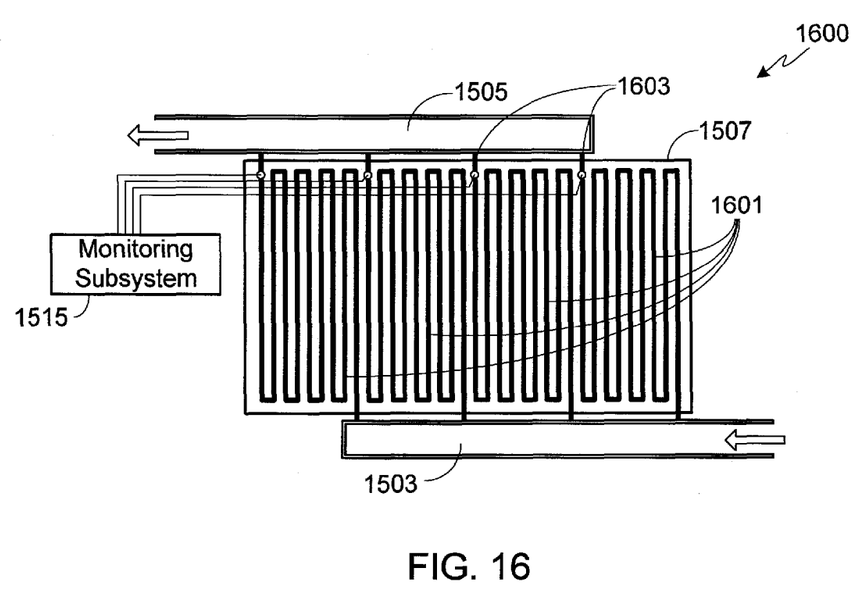
FIG. 16 illustrates various flow and/or pressure sensor locations in a battery pack or battery pack module utilizing multiple cooling loops.

FIG. 16 illustrates another common cooling conduit configuration, one in which cooling conduits 1601 form one or more loops within the battery pack, or within each battery pack module integrated within the battery pack. The individual cooling loops may be coupled together using a manifold or by other means. In exemplary system 1600, four cooling loops are shown coupled to coolant intake manifold 1503 and a coolant exhaust manifold 1505. Although sensors may be integrated into the exhaust manifold alone, or integrated into both the intake and exhaust manifolds, as previously noted sensors integrated into the manifolds are less sensitive to minor variations in coolant flow and/or pressure resulting from the deformation of individual coolant conduits when an object impacts the bottom battery pack enclosure panel. Therefore in the preferred embodiment and as shown in FIG. 16, integrated within each coolant loop 1601 is at least one sensor 1603. Preferably each sensor 1603 is located near the juncture of the corresponding coolant loop and the exhaust manifold 1605 in order to maximize sensor sensitivity to flow and pressure changes arising from conduit deformation.

Figure 17:
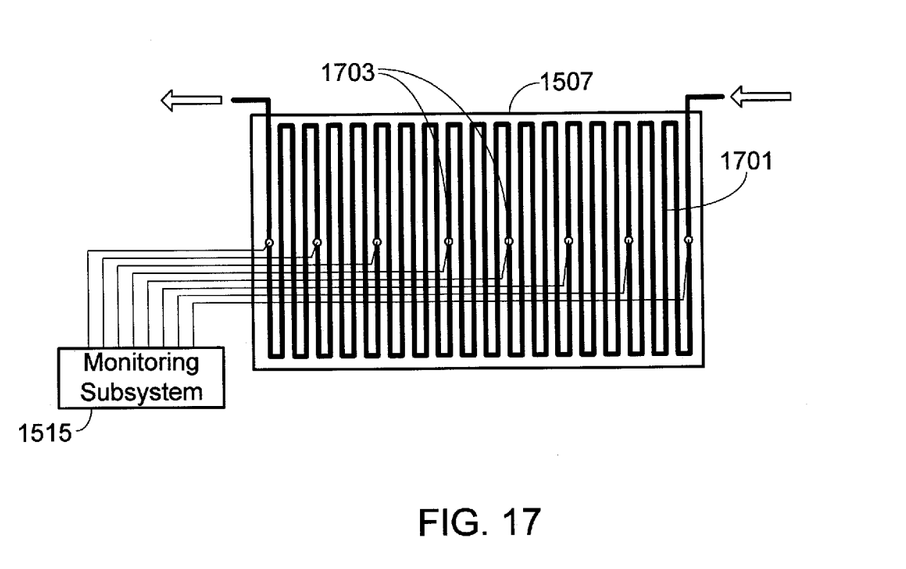
FIG. 17 illustrates various flow and/or pressure sensor locations in a battery pack or battery pack module utilizing a single cooling loop.

FIG. 17 illustrates another common cooling conduit configuration, one in which a single cooling loop 1701 is installed within battery pack enclosure 1507, where enclosure 1507 may comprise the entire pack or be illustrative of a single battery pack module designed for integration within a larger battery pack. At least one, and preferably multiple, sensors 1703 are incorporated into the conduit 1701 that forms the single cooling loop, where sensors 1703 monitor variations in coolant flow and/or pressure within the conduit. Preferably sensors 1703 are incorporated throughout the cooling loop as shown.

Figure 18:
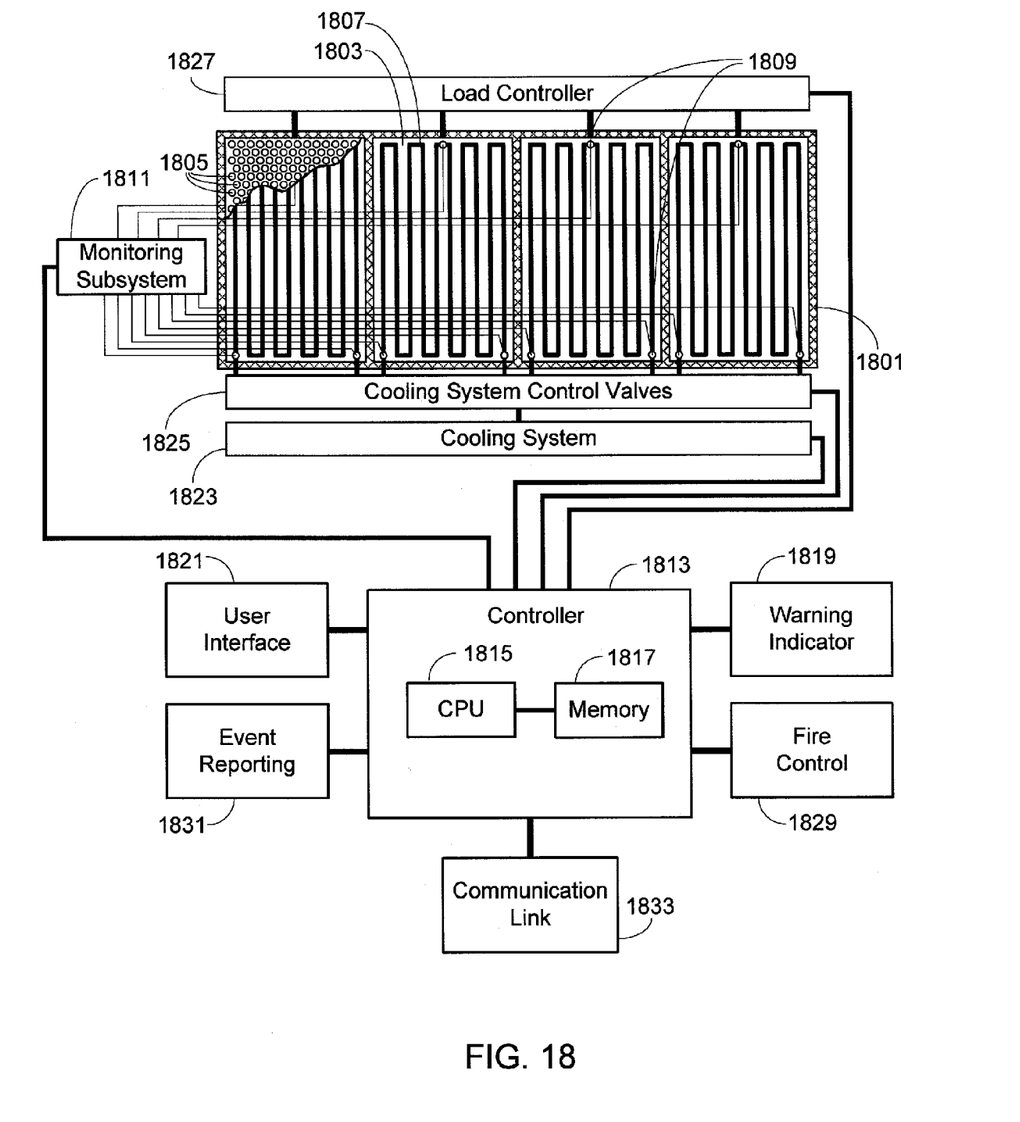
FIG. 18 provides a block diagram of an exemplary control system for use with the battery pack cooling conduit deformation monitoring system of the invention.

FIG. 18 illustrates a block diagram of an exemplary control system for use with the battery pack damage monitoring system of the invention. In this exemplary embodiment, the battery pack 1801 includes four battery modules 1803. Each module 1803 includes a plurality of batteries 1805, interconnected to provide the desired power levels for the vehicle to which battery pack 1801 is mounted. For purposes of clarity, battery interconnects and battery mounts are not included in this view, and only a few batteries 1805 are shown within one of the battery modules 1803. Interposed between the bottom surface of each battery 1805 and the lower battery pack enclosure panel is the cooling conduit 1807. In this embodiment, each battery module 1803 includes a single cooling loop, although the control system of the invention is equally applicable to other configurations as noted above.

In the embodiment shown in FIG. 18, coolant flow and/or pressure within each individual cooling loop is monitored by three sensors 1809. The output signal from each sensor 1809 is monitored using subsystem 1811 which, in turn, is monitored by controller 1813. If desired, the functionality of subsystem 1811 may be integrated into controller 1813. System controller 1813 includes a central processing unit (CPU) 1815 and a memory 1817. Memory 1817 may be comprised of EPROM, EEPROM, flash memory, RAM, a solid state disk drive, a hard disk drive, or any other memory type or combination of memory types.

Preferably when one of the sensors 1809 signals a change in the flow of coolant or the pressure within a coolant conduit 1807, controller 1813 compares the current flow/pressure with a range of acceptable flows/pressures stored in memory 1817. If the flow rate or pressure is still within the acceptable range, controller 1813 treats the change as a non-event. In some embodiments, the system is configured to alter the range of acceptable flows/pressures depending upon the current cooling system operating conditions. For example, if the battery pack is running warmer than desired, the cooling system may be configured to increase the flow of coolant through conduits 1807, thereby withdrawing more heat from the batteries 1805. In this instance the range of acceptable coolant flow rates and/or pressures would be different than if the batteries were not running warm and the coolant flow had not been increased.

Since a change in the coolant flow rate or pressure, as detected by sensors 1809, may be indicative of an obstacle striking the lower battery pack enclosure panel with sufficient force to deform a portion of a cooling conduit 1807, in at least one embodiment of the invention controller 1813 is configured to perform one or more tasks upon detection of an out-of-range reading of one of the sensors 1809. Alternately, controller 1813 may be configured to determine the potential severity of the impact based on the current flow rate/pressure, or based on the amount that the flow rate/pressure changes, and then perform one or more tasks based on the determined severity. For example, a minor change that yields a sensor reading that is not within the acceptable range may only warrant activation of a warning indicator. In contrast, a major change, such as termination of coolant flow, may be deemed a severe event and require controller 1813 to make adjustments to the cooling system, the battery load, etc. Details of possible responses to be performed by controller 1813 upon detection of battery pack damage are provided below. It will be appreciated that controller 1813 may be programmed to perform a single response or multiple responses and in the case of multiple responses, they may be performed either serially or in parallel.

Upon detection of a battery pack impact, as determined by controller 1813 based on the monitored coolant flow and/or pressure as detected by one or more sensors 1809, the system may be configured to activate a warning indicator 1819. Preferably controller 1813 is configured to activate warning indicator 1819 regardless of the severity of the impact, i.e., regardless of the change in coolant flow and/or pressure as monitored by sensors 1809 and determined by subsystem 1811 or controller 1813. Warning indicator 1819 may be a sound emitted over the vehicle's sound system or through a dedicated sound system. Alternately, or in addition to an audible sound, warning indicator 1819 may use a visual indicator located in the dashboard or instrument panel. The visual indicator may also be displayed on a vehicle user interface 1821, where the user interface 1821 is also used by the vehicle's occupants to access various vehicle systems such as the audio system, navigation system, passenger cabin HVAC (heating, ventilation and air conditioning) controller, cabin lighting, etc.

Controller 1813 may be configured to make any of a variety of adjustments to the battery pack cooling system depending upon the severity of the damage to the deformable cooling conduits 1807 as well as the configuration of the battery pack and corresponding cooling system. For example, if a relatively minor change in coolant flow and/or pressure is detected, representative of a relatively minor deformation of the cooling conduit, then controller 1813 may be configured to increase the cooling provided to the battery pack by adjusting cooling system 1823, thereby helping to maintain batteries 1805 within their desired operating temperature range. Typical cooling system adjustments that may be used to compensate for the decreased coolant flow include (i) increasing the cooling capacity of the system by increasing coolant flow through the affected section of cooling conduit using the cooling system's control valves 1825, (ii) increasing the cooling capacity of the system by increasing coolant flow using the system's coolant pump (e.g., coolant pump 303), (iii) increasing heat withdrawal by activating or increasing the speed of the system's blower fan (e.g., fan 305), or (iv) increasing heat withdrawal using the system's thermal management system (e.g., system 401). If the damage to the deformable cooling conduits is extensive and indicative of a pierced or broken cooling conduit, controller 1813 may be configured to isolate the damaged portion of cooling conduit using control valves 1825, thereby preventing flooding of the battery pack and/or vehicle as well as minimizing lost coolant. By minimizing lost coolant, the unaffected battery modules may continue to be cooled.

After detecting an impact on the battery pack as evidenced by a change in coolant flow or pressure within the deformable cooling conduits 1807, controller 1813 may be configured to alter the electrical load on the batteries that are potentially affected by the change in coolant flow. For example, in the system shown in FIG. 18, when an impact is detected in one of the four battery modules, the load on the batteries within the affected module is altered using load controller 1827. Preferably controller 1813 reduces, or altogether eliminates, the load placed on the potentially affected batteries. While reducing or eliminating the load on the affected batteries will affect the performance of the electric vehicle utilizing battery pack 1801, reducing or eliminating the load may prevent the affected batteries from entering into thermal runaway. Reduction or elimination of the load placed on the affected batteries/battery module may also help to mitigate damage to other electrical system components that may occur if any of the batteries are damaged by the battery pack impact.

In some embodiments the system controller 1813 may be configured to activate a fire control system 1829 when a battery pack impact is detected or, more preferably, when a severe battery pack impact is detected in which coolant flow is significantly reduced or altogether eliminated. The fire control system 1829, which may utilize either a gas or liquid fire suppressant, is intended to minimize the risks associated with one or more of the batteries within the affected region of the battery pack undergoing thermal runaway. Preferably fire control system 1829 releases a fire retardant or suppressive agent into the affected battery module or region of the battery pack. In some configurations, the fire retardant/suppressive agent may be released into the entire battery pack.

In addition to notifying the vehicle's occupants of the battery pack impact via warning indicator 1819, in at least one embodiment controller 1813 is configured to report the event using reporting system 1831. Reporting system 1831 may simply record the event using an on-board system, for example memory 1817, thus allowing service personnel to help determine the extent of damage, damage timing, and the efficacy of the damage monitoring system. Alternately, reporting system 1831 may be configured to externally report the event, preferably reporting not just the occurrence of the event, but also event characteristics such as the exact date and time of the event, the coolant flow before and after the event, the coolant pressure before and after the event, etc. Reporting may be sent to the manufacturer, thereby providing them with data that may be used to improve battery pack impact resistance on future vehicles. Alternately, reporting may be to a service representative or other third part. Alternately, reporting may be to a web site, a web-based application, or a remote home-based system. Alternately, reporting may be to the vehicle's owner or another party via a text message or other format. Typically controller 1813 will use mobile telecommunications link 1833 to externally report an event, where telecommunications link 1833 may utilize any of a variety of different standards including, but not limited to, GSM EDGE, UMTS, CDMA2000, DECT, and WiMAX.

It should be understood that the accompanying figures are only meant to illustrate, not limit, the scope of the invention and should not be considered to be to scale.

Systems and methods have been described in general terms as an aid to understanding details of the invention. In some instances, well-known structures, materials, and/or operations have not been specifically shown or described in detail to avoid obscuring aspects of the invention. In other instances, specific details have been given in order to provide a thorough understanding of the invention. One skilled in the relevant art will recognize that the invention may be embodied in other specific forms, for example to adapt to a particular system or apparatus or situation or material or component, without departing from the spirit or essential characteristics thereof. Therefore the disclosures and descriptions herein are intended to be illustrative, but not limiting, of the scope of the invention.

What is claimed is:

1. A method for detecting impact damage to a battery pack mounted to a vehicle, said battery pack configured to house a plurality of batteries, the method comprising the steps of:
    positioning a plurality of deformable cooling conduits between a lower surface of each of said plurality of batteries and an upper surface of a lower battery pack enclosure panel, wherein integral to each of said plurality of deformable cooling conduits is at least one coolant channel containing a coolant;
    absorbing thermal energy directly from said plurality of batteries via said plurality of deformable cooling conduits positioned between said lower surface of each of said plurality of batteries and said upper surface of said lower battery pack enclosure panel;
    incorporating at least one sensor into said plurality of deformable cooling conduits, wherein said at least one sensor monitors a characteristic of said coolant;
    monitoring said at least one sensor;
    outputting a first control signal to a system controller when said characteristic monitored by said at least one sensor is within a preset range of values; and
    outputting a second control signal to said system controller when said characteristic monitored by said at least one sensor is outside of said preset range of values, wherein deformation without breakage of a portion of said plurality of deformable cooling conduits due to an object striking a lower surface of said lower battery pack enclosure panel causes said characteristic monitored by said at least one sensor to fall outside of said preset range of values.

2. The method of claim 1, wherein said characteristic of said coolant is coolant flow rate, wherein said at least one sensor comprises a flow rate sensor, and wherein said at least one sensor monitors said coolant flow rate.

3. The method of claim 1, wherein said characteristic of said coolant is pressure, wherein said at least one sensor comprises a pressure sensor, and wherein said at least one sensor monitors said coolant pressure.

4. The method of claim 1, further comprising the step of activating an on-board warning indicator when said system controller receives said second control signal.

5. The method of claim 1, further comprising the step of modifying coolant flow through at least a portion of said plurality of deformable cooling conduits when said system controller receives said second control signal.

6. The method of claim 1, further comprising the step of terminating coolant flow through at least a portion of said plurality of deformable cooling conduits when said system controller receives said second control signal.

7. The method of claim 1, further comprising the step of activating a fire control system when said system controller receives said second control signal.

8. The method of claim 1, further comprising the step of modifying an electrical load applied to at least a portion of said plurality of batteries when said system controller receives said second control signal.

9. The method of claim 1, further comprising the step of recording an event log entry using an on-board recording system each time said system controller receives said second control signal.

10. The method of claim 1, further comprising the step of transmitting an event report using an on-board communication system each time said system controller receives said second control signal.

11. The method of claim 1, further comprising the step of positioning a thermal insulator between said plurality of deformable cooling conduits and said upper surface of said lower battery pack enclosure panel.

12. The method of claim 11, further comprising the step of positioning a plurality of stand-offs between said plurality of deformable cooling conduits and said upper surface of said lower battery pack enclosure panel, wherein said plurality of stand-offs define a gap between said plurality of deformable cooling conduits and said upper surface of said lower battery pack enclosure panel, wherein said gap is filled with said thermal insulator, and wherein said thermal insulator is comprised of air.

13. The method of claim 11, further comprising the step of positioning a thermally conductive material adjacent to and in contact with a lower surface of each of said plurality of deformable cooling conduits.

* * * * *